United States Patent [19]
Liao

[11] Patent Number: 5,592,168
[45] Date of Patent: Jan. 7, 1997

[54] HIGH SPEED DUAL-SLOPE ANALOG-TO-DIGITAL CONVERTER

[75] Inventor: Tsuoe-Hsiang Liao, Hsinchu, Taiwan

[73] Assignee: Industrial Technology Research Institute, Hsinchu, Taiwan

[21] Appl. No.: 235,783

[22] Filed: Apr. 29, 1994

[51] Int. Cl.⁶ ..................................................... H03M 1/50
[52] U.S. Cl. ............................................ 341/167; 341/118
[58] Field of Search ................................... 341/118, 120, 341/166, 167, 168

[56] References Cited

U.S. PATENT DOCUMENTS

| | | | |
|---|---|---|---|
| Re. 34,428 | 11/1993 | George et al. | 341/118 |
| 3,942,173 | 3/1976 | Wold | 341/118 |
| 4,217,542 | 8/1980 | Abbe et al. | 341/167 |
| 4,395,701 | 7/1983 | Evans | 341/166 |
| 4,608,553 | 8/1986 | Ormond | 341/166 |
| 4,694,277 | 9/1987 | Takahashi | 341/166 |
| 4,739,305 | 4/1988 | Naito | 341/166 |
| 4,799,041 | 1/1989 | Layton | 341/120 |
| 5,117,227 | 5/1992 | Goeke | 341/166 |
| 5,194,868 | 3/1993 | Bahng et al. | 341/167 |

*Primary Examiner*—Marc S. Hoff
*Attorney, Agent, or Firm*—H. C. Lin, Patent Agent

[57] ABSTRACT

A unified zero-reset phase is used in a dual-slope analog-to-digital converter (ADC) to: (1) derive a correction voltage to cancel any error due to offset and/or residue voltages in the components of the ADC in the subsequent integration phase and the de-integration phase; (2) reset the output of the integrator in the ADC to zero quickly when there is an overflow condition due to excessive analog input signals. The combined function is accomplished by negative feedback from the output of the comparator to the input of the buffer. The negative feedback resets the integrator output to zero quickly under overflow condition. The correction voltage is stored in the integrating capacitor and a coupling capacitor to the integrating amplifier.

3 Claims, 2 Drawing Sheets

HIGH SPEED DUAL-SLOPE ANALOG-TO-DIGITAL CONVERTER

BACKGROUND

Early dual-slope analog-to-digital converters (ADC) operate with four phases: (1) the auto-zero phase, (2) the integration phase, (3) the de-integration phase, and (4) the zero-integration phase. The structure and the operation are as follows:

(1) The purpose of the auto-zero phase is to correct for the residue spurious voltage created during the integration and de-integration phases, and the offset voltage due to imperfect matching of the differential transistor pair of all the operational amplifiers in the ADC. FIG. 1 shows the block diagram of an auto-zero circuit, which includes a buffer 201, an integrator 202 and a comparator 203. With this arrangement of the buffer 201, the integrator 202 and the comparator 203, the undesirable residue spurious voltages and offset voltages can be eliminated by the capacitors 102, 103 and the resistor 101. The resistor 101 and the capacitor 103 perform the integration. Ideally, when the operational amplifier is used in the buffer, the integrator and the comparator have zero input offset voltages, a common calibrating voltage Vcom, say 0 volt, applied to the input of the buffer 201 should yield the same Vcom at the output of the comparator 203, which is connected as a voltage follower. However, due to the input offset voltage of non-ideal operational amplifiers and residue voltages during the settling time of the ADC, the output of the comparator may be different from Vcom. The error voltage due to different causes appears across the reset capacitor 102 and is stored for correcting the analog input voltage during the subsequent integration phase.

(2) FIG. 2 shows the block diagram for the integration phase, which include a buffer 301, an integrator 302 and a comparator 303. The input voltage Vin passes through the buffer 301 to the integrator for a fixed amount of time to store charges in the capacitor 401. The comparator 303 now functions as a high gain operational amplifier without any negative feedback. The correction voltage previously stored in the reset capacitor 102 is now used to cancel the errors due to any offset and residue voltages. This kind of automatic error correction technique is widely used in the ADC art.

(3) FIG. 3 shows the circuit diagram for the de-integration phase. The circuit is fed with an opposite polarity reference voltage Vref to effect de-integration. When the output of the integrator 502 returns to the initial point, say 0 volt, the comparator switches state and stops the de-integration process. If the integration time is $t_{INT}$, the de-integration time $t_{DE}$ is related to tINT as follows:

$$t_{DE} = \frac{|VIN|}{|VREF|} t_{INT} \quad [1]$$

(4) FIG. 4 shows the block diagram for effecting zero integrated charge at the output of the integrator. This phase is necessary to prevent the integrator from not returning to the original state when $t_{DE}$ exceeds a maximum allowed time. This situation may occur when the input analog signal is excessive and represents an overflow condition. During this phase, the output of the comparator is negatively fed back to the input of the integrator to quickly reset the output of the integrator to zero. The zero integrated charge reset circuit includes an integrator 601 and a comparator 602. If the output charge does not return to the initial condition after the maximum allowed tDE, it indicates that there is an overflow of the input signal. When the overflow condition exists, the output of the comparator 602 is fed back to the input of the input of the integrator 601 to reset the output voltage of the integrator 601 back to the initial point before the first phase starts again.

From the foregoing description, it can be seen that a prior-art dual-slope ADC uses four different phases to perform two basic functions and two zero-setting functions. The two basic functions refer to the integration phase and the de-integration phase, and the two zero-setting function refers to the auto-zero phase and the zero integrated charge phase. Such a four-phase operation is time-consuming and slows down the speed of the ADC.

SUMMARY

An object of this present invention is to speed up the operation of a dual-slope ADC. Another object of this invention is to simplify the operation of the dual-slope ADC. Still another object of the present invention is to use only three phases to complete a sampling cycle.

These objects are achieved in this invention by combining the two zero-setting phases into one zero-setting phase. This single zero-setting phase speeds up the operation of the ADC.

In this invention, the auto-zero reset phase and the zero-integrated charge reset phase are combined into one zero-reset phase. This novel dual-slope ADC includes only a three-phase circuit: a signal integration phase, a signal de-integration phase and a unified zero-reset phase. The circuit is simpler than prior art and the operating speed is greatly enhanced.

DETAILED DESCRIPTION OF THE PREFERRED EMBODIMENT

The feature of the present invention is that there are only three phases to implement the dual-slope analog-to-digital conversion, namely: the signal integration phase, the signal de-integration phase and a unified zero-reset phase.

Figure 1:
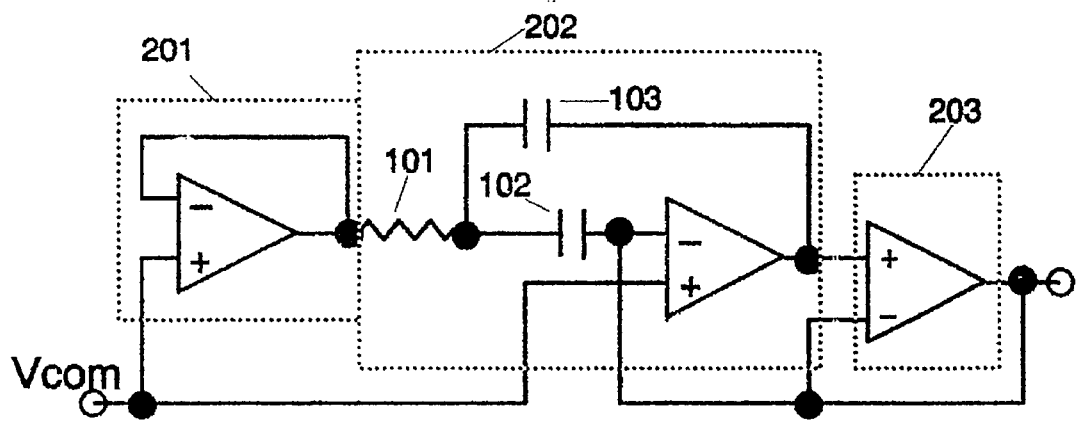
FIG. 1 shows the block diagram of a conventional dual-slope ADC during the auto-zero phase.
Figure 2:
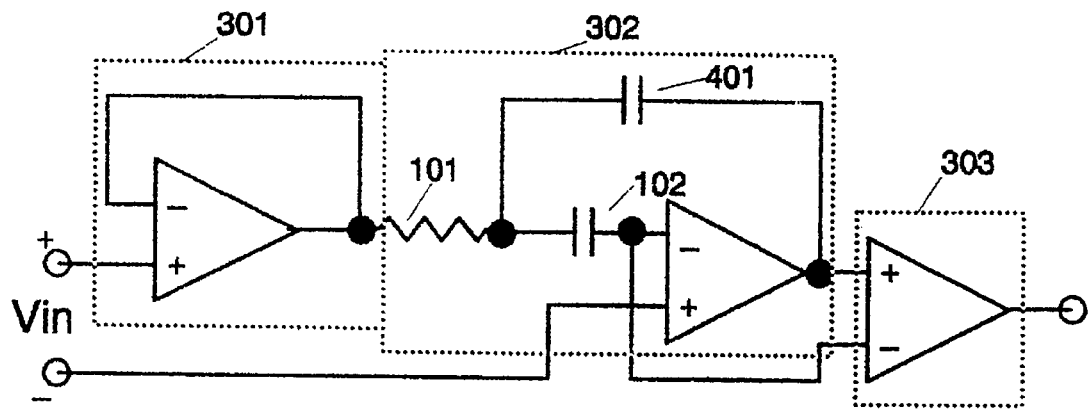
FIG. 2 shows the block diagram of a conventional dual-slope ADC during the signal integration phase.
Figure 3:
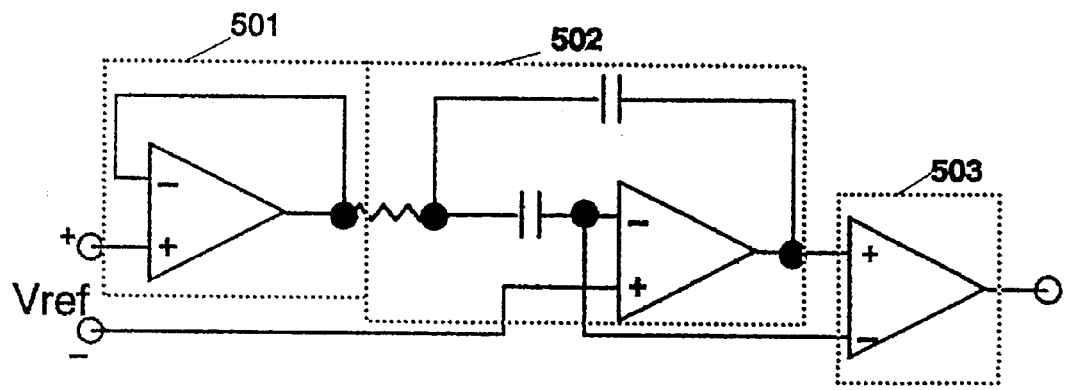
FIG. 3 shows the block diagram of a conventional dual-slope ADC during the signal de-integration phase.
Figure 4:
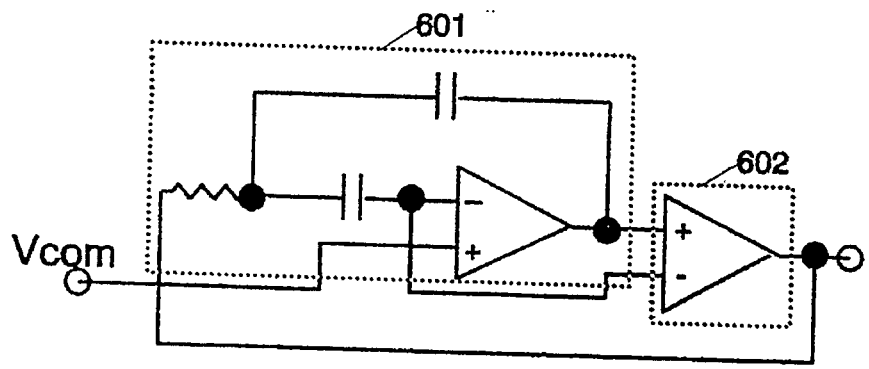
FIG. 4 shows the block diagram of a conventional dual-slope ADC during the zero-integrated charge reset phase.

In this invention, the operation and the configuration for the signal integration and de-integration phases are similar to the conventional dual-slope ADC described in FIGS. 2 and 3.

In the present dual-slope ADC, a single unified zero-reset phase is used. In this phase, both the auto-zero function and the zero integrated charge reset function are implemented. The circuit structure is simplified. More importantly, the operating speed of the ADC is greatly enhanced.

Figure 5:
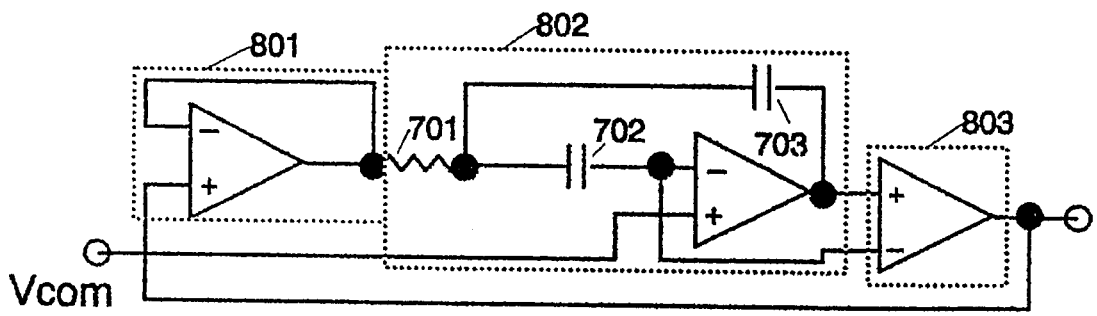
FIG. 5 shows the block diagram of an improved dual-slope ADC during a unified zero-reset phase based on the present invention.

FIG. 5 shows the block diagram for the unified zero-reset phase. The circuit includes a buffer 801, an integrator 802 and a comparator 803. The output of the buffer 801 is connected to the input of the integrator 802. The output of the integrator 802 is connected to the input of the comparator 803. The output of the comparator 803 is fed back to the buffer 801. Both the buffer 801 and the comparator 803 comprise an operational amplifier. The integrator comprises an amplifier, an integrating resistor 701, an integrating capacitor 703 and a zero-reset capacitor 702. The zero-reset capacitor 702 and the integrating resistor 701 are connected to one terminal of the integrating capacitor 703. The other end of the zero-reset capacitor 702 is connected to the inverting terminal of the integrating amplifier as well as the inverting input terminal of the comparator. The output of the comparator is fed back to the non-inverting input of the buffer 801. A common calibrating voltage Vcom is applied to the non-inverting input of the integrating amplifier during this phase. This unified zero-reset phase can perform the combined function of correcting for any input offset voltages and residue voltages of the operational amplifiers and zero-reset of the integrated charge at the output of the integrator. The explanation is as follows:

1. When there is no interference, the correction voltage for the buffer 801, the integrator 802 and the comparator 803 are stored in the capacitors 702, 703. Therefore, the arrangement has an auto-zero function.

2. When the input signal is in an overflow condition with the output from the integrator 802 connected to the input of the comparator 803, the output of the comparator 803 connected to the input of the buffer 801, and the output of the buffer 801 connected to the input of the integrator 802, the negative feedback loop causes the output of the integrator 802 to return to the initial point very quickly. Therefore, the operation performs the function of zero charge reset of the integrator output.

From the foregoing description, it can be seen that the present unified zero-reset phase performs both the input offset and residue voltages correction function and zero integrated charge reset function simultaneously. The circuit structure is simple. The speed of the dual-slope ADC is improved by one-quarter. For instance, a 13-bit A/D converter has a resolution of ±4000 ($2*2^{12}=2^{13}$). In the past, 8000 pulse periods are required to convert a full scale input signal. With the present invention, only 6000 pulse periods are required instead.

The concept of a unified automatic offset/residue voltage reset and zero charge reset is by no means limited to a dual-slope ADC. Any ADC requiring auto-reset of offset and residue voltages and zero-reset of integrated charge, as is usually the case with MOSFETs, can adopt the arrangement of the present invention.

What is claimed is:

1. A dual-slope analog-to-digital converter including a buffer, an integrator and a comparator, the operation phases of said converter comprising:

a signal integrator phase during which said buffer, said integrator and said comparator are connected as an integrating circuit that is fed with an analog input signal for integrating said input signal to an integrated voltage at the output of said integrator;

a signal de-integration phase during which said integrating circuits is fed with a reference voltage of opposite polarity to said analog input signal for discharging said integrated voltage toward an initial voltage;

a unified zero-reset phase during which said buffer, said integrator and said comparator are connected as a unified zero-reset circuit that is fed with a common calibrating voltage to correct for offset and residue voltages of said integrating circuit and to quickly reset the output of said integrator to said initial voltage at the end of said de-integration phase, said unified zero-reset circuit comprising:
said buffer,
said integrator, having an amplifier, an integrating capacitor, an integrating resistor, and a reset capacitor which is connected between the inverting input terminal and the junction of said integrating capacitor and said integrating resistor, the input of said integrator connected to the output of said buffer, said comparator, having a non-inverting input terminal connected to the output of said integrator, an inverting input terminal connected to the inverting input terminal of said amplifier in said integrator, and an output terminal coupled to the input of said buffer;

said common calibrating voltage applied to the non-inverting input terminal of said amplifier in said integrator.

2. A dual-slope analog-to-digital convertor as described in claim 1, wherein said buffer is a voltage follower.

3. A dual-slope analog-to-digital converter as described in claim 1, wherein said amplifier is an operational amplifier.

\* \* \* \* \*